(12) United States Patent
Chung et al.

(10) Patent No.: US 7,573,132 B2
(45) Date of Patent: Aug. 11, 2009

(54) WIRING STRUCTURE OF A SEMICONDUCTOR DEVICE AND METHOD OF FORMING THE SAME

(75) Inventors: Dae-Hyuk Chung, Seongnam-si (KR); In-Seak Hwang, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 125 days.

(21) Appl. No.: 11/488,707

(22) Filed: Jul. 19, 2006

(65) Prior Publication Data
US 2007/0020975 A1  Jan. 25, 2007

(30) Foreign Application Priority Data
Jul. 21, 2005 (KR) .................. 10-2005-0066343

(51) Int. Cl.
*H01L 29/40* (2006.01)
(52) U.S. Cl. .................. 257/748; 257/750; 257/751; 257/755; 438/657
(58) Field of Classification Search .................. 257/734, 257/741, 748, 750, 751, 752, 754, 755, 763, 257/E23.145; 438/630, 639, 657
See application file for complete search history.

(56) References Cited

U.S. PATENT DOCUMENTS

| 4,641,420 | A | * | 2/1987 | Lee ............................. 428/621 |
| 5,306,952 | A | * | 4/1994 | Matsuura et al. ............. 257/165 |
| 6,271,125 | B1 | * | 8/2001 | Yoo et al. .................... 438/637 |
| 6,455,424 | B1 | * | 9/2002 | McTeer et al. ............... 438/675 |
| 6,545,360 | B1 | * | 4/2003 | Ohkubo et al. .............. 257/758 |
| 7,074,717 | B2 | * | 7/2006 | Rhodes ....................... 438/639 |

FOREIGN PATENT DOCUMENTS

| JP | 2002-203810 | 7/2002 |
| KR | 10-2002-0002086 | 1/2002 |
| KR | 10-321738 | 1/2002 |

* cited by examiner

*Primary Examiner*—Zandra Smith
*Assistant Examiner*—Paul E Patton
(74) *Attorney, Agent, or Firm*—Harness, Dickey & Pierce, P.L.C.

(57) ABSTRACT

A wiring structure of a semiconductor device may have an insulation layer, a spacer and a plug. The insulation layer may be provided on a substrate and may have an opening through which a contact region of the substrate is exposed. The spacer may be provided on a sidewall of the opening. The plug may fill the opening and may include a polysilicon pattern doped with impurities, a metal silicide pattern, and a metal pattern sequentially provided on the substrate.

5 Claims, 14 Drawing Sheets

WIRING STRUCTURE OF A SEMICONDUCTOR DEVICE AND METHOD OF FORMING THE SAME

PRIORITY STATEMENT

This application claims priority under 35 USC § 119 from Korean Patent Application No. 2005-66343 filed on Jul. 21, 2005, the content of which is herein incorporated by reference in its entirety.

BACKGROUND

1. Field of the Invention

Example embodiments of the present invention relate to a wiring structure of a semiconductor device and a method of forming the wiring structure of the semiconductor device. More particularly, example embodiments of the present invention relate to a wiring structure of a semiconductor device wherein damage generated by chemicals may be reduced and a method of forming the wiring structure of the semiconductor device wherein damage caused by the chemicals may be reduced.

2. Description of the Related Art

A semiconductor device may be operated at a high speed and have a large storage capacitance. Semiconductor technology has been developed to improve the integration degree, the reliability and/or the response capability of the semiconductor device. A wiring structure, which may include a plug and a conductive line and a chief element for transferring electrical signals, may be implemented in a semiconductor device.

A semiconductor device may have small width wirings and narrow intervals between the wirings. Such wirings may be difficult to fabricate while achieving a desired high integration degree.

For example, a photolithography process for patterning a fine-sized contact hole and/or a conductive line so as to form a plug may be difficult to perform. Also, performing an etching process on a substrate may be arduous while avoiding defects such as, for example, a not-open defect due to a high aspect ratio caused by the high integration degree. Further, the contact hole may be deformed in a subsequent cleaning process (for example).

A cleaning process and/or a wet etching process may be performed on a predetermined contact hole including a plug therein. The chemicals in a cleaning solution and/or an etching solution may penetrate into a sidewall of the contact hole, so that a neighboring plug in a neighboring contact hole may be contaminated by the chemicals in the cleaning process and/or the wet etching process. Such contamination may cause a processing defect in the plug. The processing defect caused by the chemicals may induce more significant problems when the plug comprises a metal having a high reactivity with the chemicals.

FIG. 1 is a cross-sectional view of a processing defect that may occur in a conventional wiring structure generated by chemicals (for example).

Referring to FIG. 1, when a cleaning process and/or an etching process is performed on an opening 18, chemicals in a cleaning solution and/or an etching solution may permeate into a first plug 12 and/or a second plug 16 adjacent to the opening 18. The first and the second plugs 12 and 16 may be misaligned with each other, and in this case, the opening 18 may be positioned near the first plug 12 and/or the second plug 16. Thus, the chemicals may more easily permeate into the first plug 12 and/or the second plug 16.

The chemicals may cause a metal silicide pattern 14 and/or a metal pattern (not shown) in the first and the second plugs 12 and 16 to be melted and/or eroded, so that an electrical resistance may increase at a boundary area of the first and the second plugs 12 and 16. In addition, the first and the second plugs 12 and 16 may not be electrically connected with each other.

SUMMARY

According to an example, non-limiting embodiment, a wiring structure of a semiconductor device may include an insulation layer provided on a substrate. The insulation layer may have an opening through which a contact region may be exposed. A spacer may be provided on a sidewall of the opening. A plug, which may include a polysilicon pattern doped with impurities, a metal silicide pattern and a metal pattern, may be sequentially stacked on the contact region in the opening.

According to another example, non-limiting embodiment, a method of forming a wiring structure of a semiconductor device may involve providing an insulation layer on a substrate. The insulation layer may have an opening through which a contact region may be exposed. A spacer may be provided on a sidewall of the opening. A polysilicon pattern doped with impurities, a metal silicide pattern and a metal pattern may be sequentially provided on the contact region to provide a plug in the opening.

According to still another example, non-limiting embodiment, a wiring structure of a semiconductor device may include a first insulation layer provided on a substrate. The first insulation layer may have a first opening through which a first contact region may be exposed. A spacer may be provided on a sidewall of the first opening. A wiring, which may include a polysilicon pattern doped with impurities, a metal silicide pattern, and a metal pattern, may be sequentially stacked on the first contact region in the opening. A second insulation layer may be provided on the first insulation layer to cover the wiring. The second insulation layer may have a second opening through which a second contact region is exposed. A plug may fill the second opening.

According to still another example, non-limiting embodiment, a method of forming a wiring structure of a semiconductor device may involve providing a first insulation layer on a substrate. The first insulation layer may have a first opening through which a first contact region is exposed. A spacer may be provided on a sidewall of the first opening. A polysilicon pattern doped with impurities, a metal silicide pattern and a metal pattern may be sequentially provided on the first contact region to provide a wiring in the first opening. A second insulation layer may be provided on the first insulation layer to cover the wiring. The second insulation layer may have a second opening through which a second contact region is exposed. A plug may fill the second opening.

BRIEF DESCRIPTION OF THE DRAWINGS

Example, non-limiting embodiments of the present invention will be described with reference to the accompanying drawings

DESCRIPTION OF EXAMPLE, NON-LIMITING EMBODIMENTS

Figure 1:
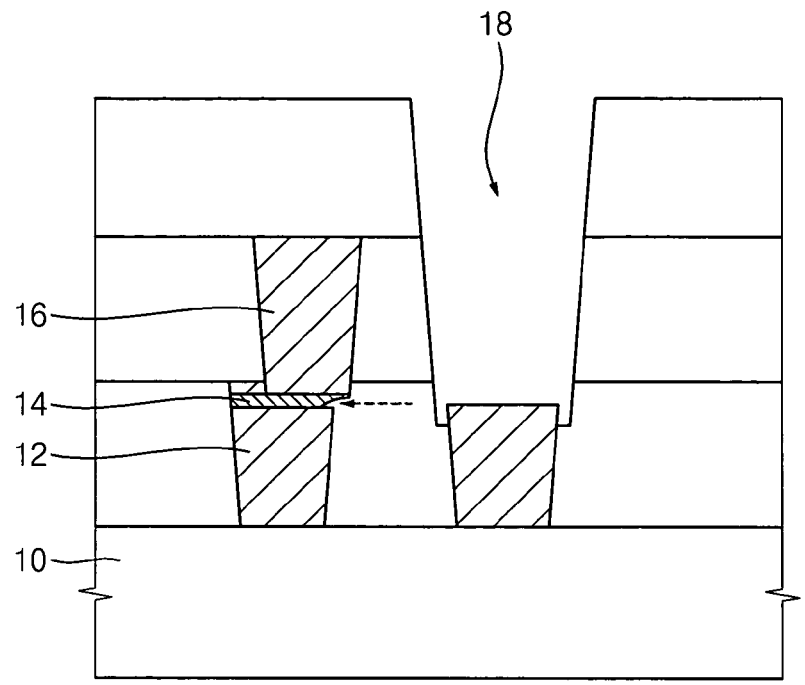
FIG. 1 is a cross-sectional view of a failure that may be caused by permeations of chemicals while forming a wiring structure by a conventional method.

Example, non-limiting embodiments of the present invention are described with reference to the accompanying drawings. The present invention may, however, be embodied in many different forms and should not be construed as limited to the example embodiments set forth herein. Rather, the example embodiments are provided so that this disclosure will be thorough and complete, and will fully convey the scope of the present invention to those skilled in the art. In the drawings, the sizes and relative sizes of layers and regions may be exaggerated for clarity. The drawings are not to scale. Like reference numerals refer to like elements throughout.

It will be understood that when an element or layer is referred to as being "on," "connected to" and/or "coupled to" another element or layer, it can be directly on, connected and/or coupled to the other element or layer or intervening elements or layers may be present. In contrast, when an element is referred to as being "directly on," "directly connected to" and/or "directly coupled to" another element or layer, there are no intervening elements or layers present. As used herein, the term "and/or" includes any and all combinations of one or more of the associated listed items.

Although the terms first, second, third etc. may be used to describe various elements, components, regions, layers and/or sections, these elements, components, regions, layers and/or sections should not be limited by these terms. The terms may be used to distinguish one element, component, region, layer or section from another element, component, region, layer or section. For example, a first element, component, region, layer and/or section discussed below could be termed a second element, component, region, layer and/or section without departing from the teachings of the present invention.

Spatially relative terms, such as "beneath," "below," "lower," "above," "upper" and the like, may be used for ease of description to describe one element and/or feature's relationship to another element(s) and/or feature(s), for example, as illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements and/or features. The device may be otherwise oriented (rotated 90 degrees or at other orientations) and the spatially relative descriptors used herein interpreted accordingly.

The terminology used herein is for the purpose of describing example embodiments only and is not intended to be limiting of the present invention. As used herein, the singular forms "a," "an" and "the" are intended to include the plural forms as well, unless the context clearly indicates otherwise. It will be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the invention are described with reference to cross-section illustrations that are schematic illustrations of idealized example embodiments (and intermediate structures) of the present invention. As such, variations from the shapes of the illustrations as a result, for example, of manufacturing techniques and/or tolerances, may be expected. Thus, example embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from an implanted region to a non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein may have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized and/or overly formal sense unless expressly so defined herein.

Figure 2:
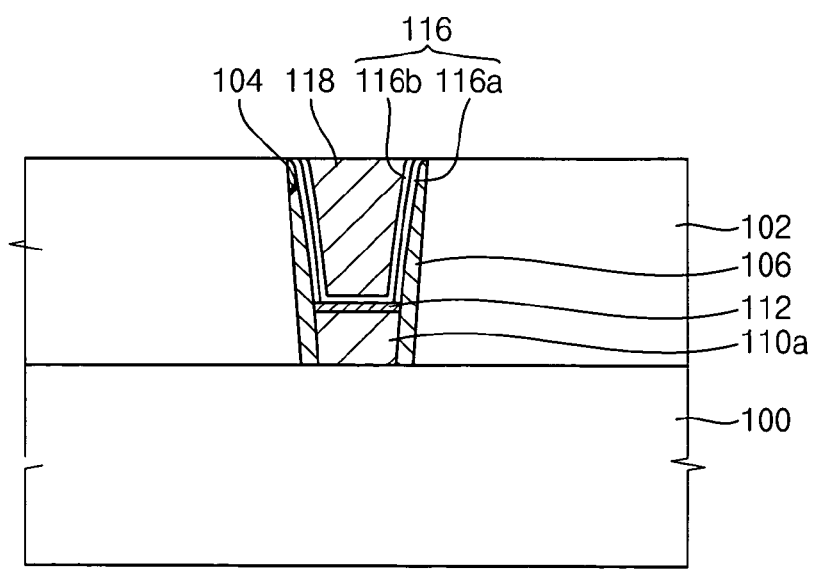
FIG. 2 is a cross-sectional view of a wiring structure of a semiconductor device in accordance with an example, non-limiting embodiment of the present invention.

FIG. 2 is a cross-sectional view of a wiring structure of a semiconductor device in accordance with an example embodiment of the present invention.

Referring to FIG. 2, the wiring structure of the semiconductor device may include an insulation layer 102 provided on a substrate 100. An opening 104 may be provided through the insulation layer 102.

By way of example only, the substrate 100 may include a single crystalline silicon substrate or a silicon-on-insulator (SOI) substrate. The opening 104 may expose a portion of the substrate 100. A space including the exposed portion of the substrate 100 by the opening 104 may be referred to as a contact region. An impurity region, which may be provided at an upper portion of the semiconductor substrate 100, may be connected to the contact region. A lower contact plug and/or a conductive pattern may be provided in the contact region. By way of example only, the lower contact plug and/or the conductive pattern may include polysilicon doped with impurities.

By way of example only, the insulation layer 102 may include silicon oxide. A lower structure such as a transistor (for example) may be provided on the substrate 100.

A spacer 106 may be provided on a side surface of the insulation layer 102 defining the opening 104. The spacer 106 may be provided on a sidewall of the opening 104. The spacer 106 may be fabricated from a material having an etching selectivity with respect to the insulation layer 102. For example, the spacer 106 may include a material hardly etched in an etching process of the insulation layer 102. For example, the spacer 106 may be fabricated from silicon nitride.

The spacer 106 may protect the opening 104 from being enlarged in a successive process. The spacer 106 may also reduce the likelihood of chemicals permeating into the opening 104 in a successive process.

A plug may be disposed in the opening 104. The plug may include a polysilicon pattern 110a doped with impurities, a metal silicide pattern 112 that may be provided on the polysilicon pattern 110a, and a metal pattern 118 that may be provided on the metal silicide pattern 112.

The polysilicon pattern 110a doped with impurities may be provided on the contact region to partially fill the opening 104. When a thickness of the polysilicon pattern 110a is less than about 50 Å, the metal silicide pattern 112 provided on the polysilicon pattern 110a may be so close to a lower portion of the spacer 106 that the chemicals used in successive processes may permeate below the lower portion of the spacer 106 and damage the metal silicide pattern 112. Thus, the polysilicon pattern 110a may have a thickness of at least about 50 Å.

When the opening 104 is filled with the polysilicon pattern 110a, a resistance of the plug may increase. Thus, the polysilicon pattern 110a may have a thickness of at least about 50 Å, and may only partially fill the opening 104.

The metal silicide pattern 112 may be provided on the polysilicon pattern 110a. The metal silicide pattern 112 may facilitate an ohmic contact between the polysilicon pattern 110a and a metal pattern 118 that may be fabricated in a subsequent process, so as to reduce a voltage barrier that may be generated between the polysilicon pattern 110a and the metal pattern 118. Accordingly, an electric current through the polysilicon pattern 110a and the metal pattern 118 may be proportional to an applied voltage despite a contact between a conductor and a semiconductor. The metal silicide pattern 112 may have a thickness of about 30 to about 300 Å. However, a thickness of the metal silicide pattern 112 may vary according to a width and/or a depth of the opening 104. By way of example only, the metal silicide pattern 112 may include titanium silicide and/or tantalum silicide.

A first barrier metal layer (not shown) may be provided on the polysilicon pattern 110a and a sidewall of the spacer 106. The polysilicon pattern 110a may be chemically reacted with the first barrier metal layer, thereby forming the metal silicide pattern 112 on the polysilicon pattern 110a. A chemical reaction may not be generated between the spacer 106 and the first barrier metal layer, and therefore the first barrier metal layer may remain on the spacer 106, thereby providing a first barrier metal layer pattern 116a on the spacer 106. By way of example only, the first barrier metal layer pattern 116a may include titanium and/or tantalum.

A second barrier metal layer pattern 116b may be provided on the metal silicide pattern 112 and the first barrier metal layer pattern 116a. By way of example only, the second barrier metal layer pattern 116b may include titanium nitride and/or tantalum nitride. The first and the second barrier metal layer patterns 116a and 116b may reduce diffusion of metal in successive processes.

In an example embodiment of the present invention, the first barrier metal layer pattern 116a may include titanium, and the second barrier metal layer pattern 116b may include tantalum nitride. In this case, the metal silicide pattern 112 may include titanium silicide.

The metal pattern 118 may be provided on the barrier metal layer pattern 116 to fill the opening 104. By way of example only, the metal pattern 118 may include tungsten, aluminum and/or copper. In an example embodiment of the present invention, the metal pattern 118 may include tungsten.

FIGS. 3 to 8 are cross-sectional views of a method that may be implemented to fabricate a wiring structure of the semiconductor device shown in FIG. 2.

Figure 3:
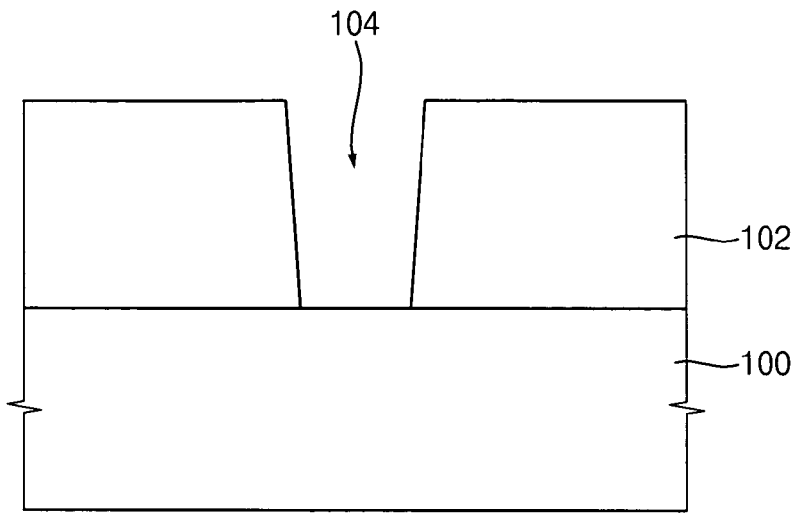
FIGS. 3 to 8 are cross-sectional views of a method that may be implemented to fabricate a wiring structure of a semiconductor device shown in FIG. 2.

Referring to FIG. 3, a preliminary insulation layer (not shown) may be provided on a substrate 100. By way of example only, the preliminary insulation layer may be provided by depositing silicon oxide on the substrate 100.

The preliminary insulation layer may be partially etched to provide an opening 104 exposing a portion of the semiconductor substrate 100, and an insulation layer 102 having the opening 104 provided through the insulation layer 102. The portion of the semiconductor substrate 100 exposed through the opening 104 may function as a contact region.

Figure 4:
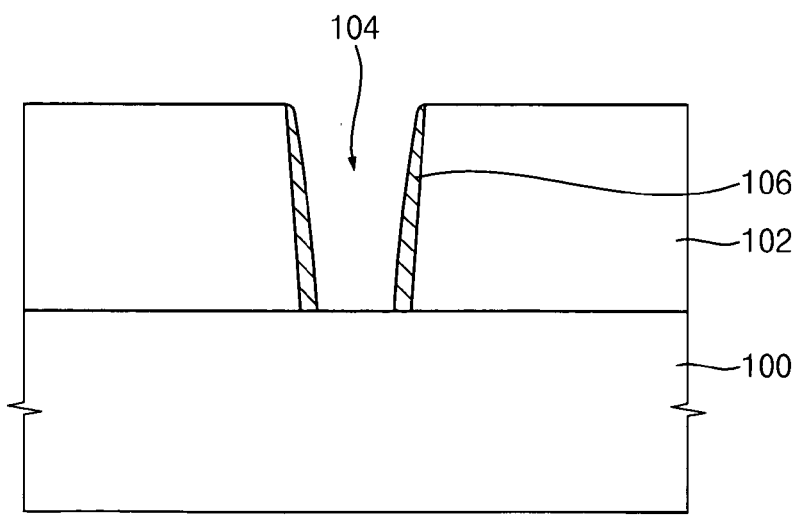

Referring to FIG. 4, a silicon nitride layer (not shown) may be provided on the contact region, a sidewall of the opening 104 and a top surface of the insulation layer 102. The silicon nitride layer may be anisotropically etched (for example) until the contact region and the top surface of the insulation layer 102 may be exposed to provide a spacer 106 on the sidewall of the opening 104.

As described above, the spacer 106 may protect the opening 104 from being enlarged in successive processes and reduce the likelihood of chemicals used in the successive processes permeating into the opening 104.

Figure 5:
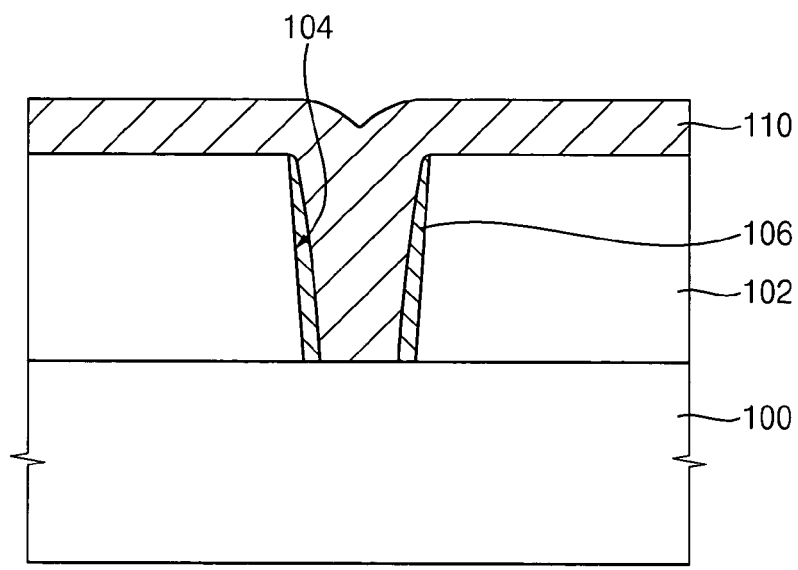

Referring to FIG. 5, a material including polysilicon doped with impurities may be deposited on the insulation layer 102 to form a polysilicon layer 110. The polysilicon layer 110 may fill the opening 104

In an example embodiment, the polysilicon layer 110 may have a sufficient thickness to fill the opening 104, so that a thickness of the polysilicon layer 110 measured from a bottom of the opening 104 may be greater than that of the polysilicon layer 110 measured from the top surface of the insulation layer 102. The polysilicon layer 110 may be partially etched in an anisotropic etching process (for example), so that a polysilicon pattern 110a (See FIG. 6) may be provided at a bottom portion of the opening 104.

Figure 6:
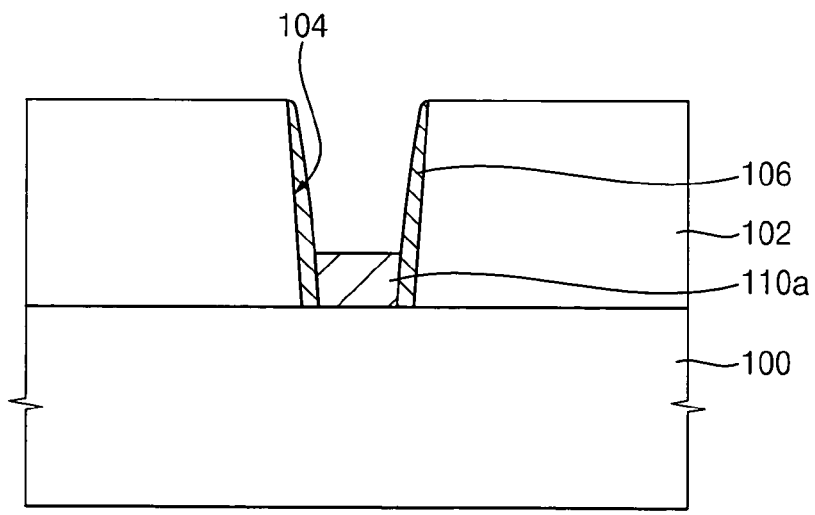

Referring to FIG. 6, a portion of the polysilicon layer 110 deposited on the insulation layer 102 and a portion of the polysilicon layer 110 deposited in the opening 104 may be removed to form the polysilicon pattern 110a partially filling the opening 104.

In an example embodiment of the present invention, the polysilicon layer 110 may be planarized by a chemical mechanical polishing (CMP) process and/or an etch back process until a top surface of the insulation layer 102 may be exposed. A remaining portion of the polysilicon layer 110 may be partially removed by an anisotropic etching process (for example) that may have an etching selectivity with respect to the spacer 106 so that the polysilicon layer 110 may only remain in the opening 104 to provide the polysilicon pattern 110a in the opening 104.

When the opening 104 is filled with the polysilicon pattern 110a and a thickness of the polysilicon pattern 110a is substantially the same as that of the insulation layer 102 to provide a contact plug in the opening 104, an electrical resistance of the contact plug may be high. In addition, when the thickness of the polysilicon layer 110a is no more than about 50 Å, chemicals (which may be used in successive processes) may permeate into the insulation layer 102 and contact/contaminate the metal silicide pattern that may be provided on the polysilicon pattern 110a.

Accordingly, the polysilicon pattern 110a may have a thickness of at least about 50 Å but less than the thickness of the insulation layer 102, so that the opening 104 may be partially filled with the polysilicon pattern 110a.

Figure 7:
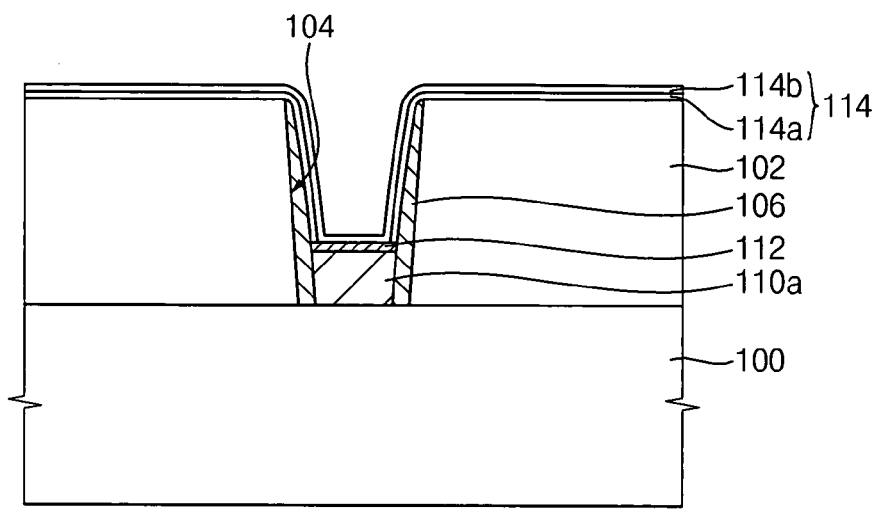

Referring to FIG. 7, a metal silicide pattern 112 may be provided on the polysilicon pattern 110a and a first barrier metal layer 114a may be provided on the spacer 106 and the insulation layer 102.

A first barrier metal may be deposited on the polysilicon pattern 110a, the spacer 106, and the insulation layer 102 by a chemical vapor deposition (CVD) process, for example. The first barrier metal on the polysilicon pattern 110a may be chemically reacted with the polysilicon, so that the first barrier metal on the polysilicon pattern 110a may be transformed into the metal silicide pattern 112. However, no chemical reaction may be generated among the first barrier metal and the spacer 106 and the insulation layer 102, so that the first barrier metal on the spacer 106 and the insulation layer 102 may remain unchanged, thereby providing the first barrier metal layer 114a on the spacer 106 and the insulation layer 102.

The metal silicide pattern 112 may be interposed between the polysilicon pattern 110a and a metal pattern that may be formed on the metal silicide pattern 112 in a successive process. The metal silicide pattern 112 may function as an ohmic layer. By way of example only, the first barrier metal layer 114a may include titanium and/or tantalum, and the metal silicide pattern 112 may include titanium silicide and/or tantalum silicide according to a material used as the first barrier metal layer 114a.

A second barrier metal layer 114b may be provided on the first barrier metal layer 114a and the metal silicide pattern 112. By way of example only, the second barrier metal layer 114b may include titanium nitride and/or tantalum nitride.

Figure 8:
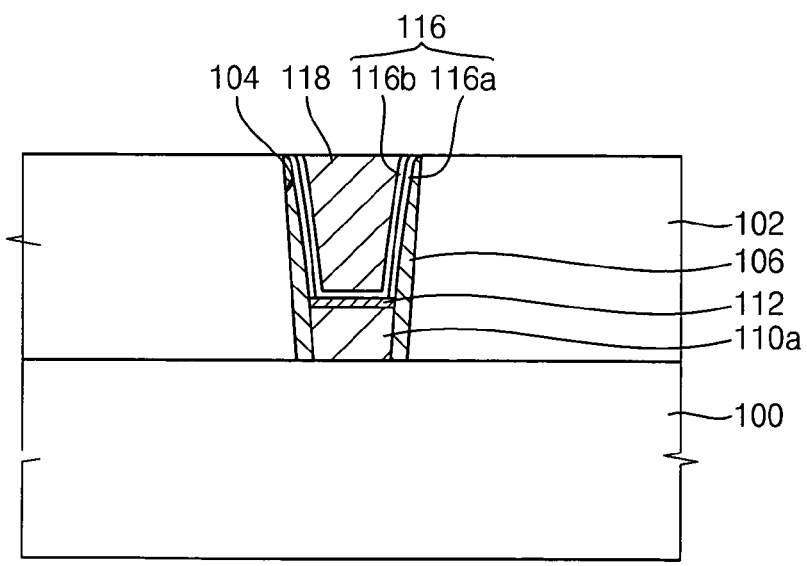

Referring to FIG. 8, a metal layer may be provided on the second barrier metal layer 114b with a sufficient thickness to fill a residual space of the opening 104. By way of example only, the metal layer may include tungsten, aluminum and/or copper. The metal layer and the first and the second barrier metal layers 114a and 114b under the metal layer may be removed from the insulation layer 102 by a planarization process (for example) until the top surface of the insulation layer 102 may be exposed. By way of example only, the planarization process may include a CMP process and/or an etch-back process. As a result, the metal layer and the barrier metal layer 114 may remain only in the space of the opening 104, thereby providing a barrier metal pattern 116 and a metal pattern 118 on the barrier metal pattern 116 in the residual space of the opening 104.

According to this example embodiment, the polysilicon pattern 110a, the metal silicide pattern 112 and the metal pattern 118 may be sequentially stacked on the substrate 100 in the opening 104, thereby providing a plug in the opening 104.

In the present embodiment, the metal layer may be removed from the insulation layer 102 and may remain only in the residual space of the opening 104. In alternative embodiments, the metal layer may also remain on the insulation layer 102 in such a structure that the metal layer remaining on the insulation layer 102 may pass through a series of the openings 104 as known to those of the ordinary skill in the art. That is, a conductive line that may be electrically connected to a plurality of plugs in the series of the openings 104 may be patterned with the plug in the opening 104 by the above-described deposition and planarization process.

Figure 9:
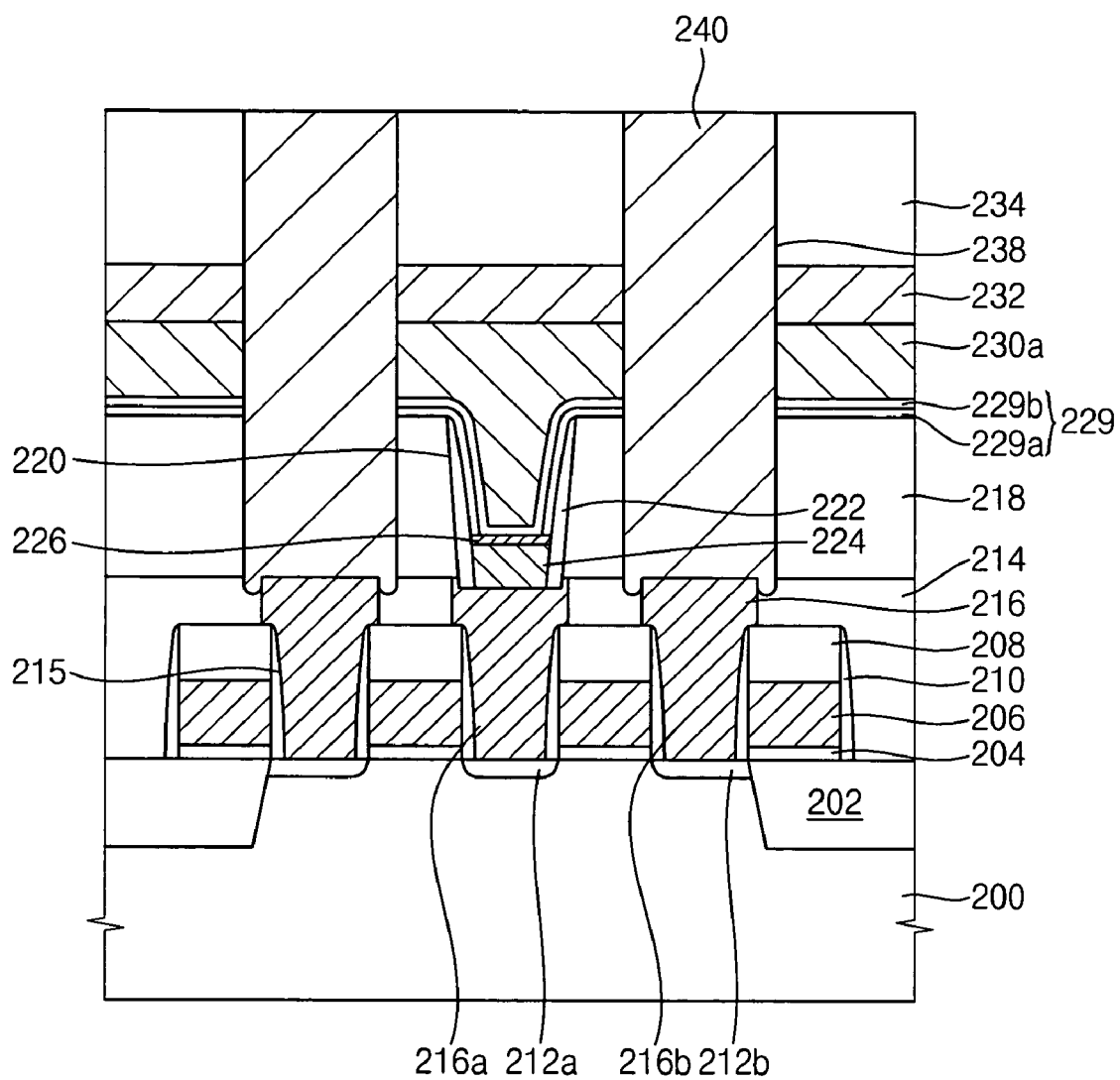
FIG. 9 is a cross-sectional view of a DRAM device having a wiring structure in accordance with an example, non-limiting embodiment of the present invention.

FIG. 9 is a cross-sectional view of a DRAM device having a wiring structure in accordance with an example embodiment of the present invention.

Referring to FIG. 9, an isolation layer 202 may be provided at an upper portion of the substrate 200 to define an active region and a field region. The active region may be defined by the field region and may be electrically isolated from neighboring active regions. A plurality of the active regions may be arranged on the substrate 200 in a first direction.

A MOS transistor may be provided at each of the active regions, and a plurality of gate electrodes of each MOS transistor may be arranged in a second direction perpendicular to the first direction as a line shape, thereby functioning as a word line of the DRAM device.

The MOS transistor may include a gate structure including a gate oxide layer pattern 204 that may be provided on the substrate 200, a gate conductive pattern 206 that may be provided on the gate oxide layer pattern 204, and a first hard mask pattern 208 that may be provided on the gate conductive pattern 206. An impurity region 212 may be provided at surface portions of the substrate 200 adjacent to the gate structure. A gate spacer 210 may be provided on a side surface of the gate structure.

By way of example only, the impurity region 212 may include a first impurity region 212a positioned at a central portion of the active region and connected to a bit line, and a second impurity region 212b positioned at an edge portion of the active region and connected to a capacitor.

A lower insulation layer 214 may be provided to cover the gate structure. By way of example only, the lower insulation layer 214 may include silicon oxide. Lower openings 215 may be provided through the lower insulation layer 214 to expose the first and the second impurity regions.

Lower plugs 216, which may include polysilicon (for example), may be provided in the lower openings 215. A plug connected to the first impurity region 212a may be referred to as a first lower plug 216a, and a plug connected to the second impurity region 212b may be referred to as a second lower plug 216b.

An insulating interlayer 218 may be provided on the lower insulation layer 214 having the lower plugs 216. By way of example only, the insulating interlayer 218 may include silicon oxide. A first opening 220 may be provided through the insulating interlayer 218 to partially expose the first lower plug 216a.

A first spacer 222 may be provided on a side surface of the insulating interlayer 218 defining the first opening 220. The first spacer 222 protects the first opening 220 from being enlarged in successive processes. In addition, the first spacer 222 may reduce the likelihood of chemicals permeating into the first opening 220 in the successive processes. The first spacer 222 may include a material having etching selectivity with respect to the insulating interlayer 218. For example, when the insulating interlayer 218 includes silicon oxide, the first spacer 222 may include silicon nitride having an etching selectivity with respect to the silicon oxide.

A polysilicon pattern 224 may be provided in the first opening 220 to partially fill the opening 220. The polysilicon pattern 224 may have a thickness of at least about 50 Å from a bottom of the first opening 220.

A metal silicide pattern 226 may be provided on the polysilicon pattern 224 to function as an ohmic layer. A first barrier metal layer pattern 229a may be provided on the spacer 222 and the insulating interlayer 218. By way of example only, the metal silicide pattern 226 may include titanium silicide and/or tantalum silicide, and the first barrier metal layer pattern 229a may include titanium and/or tantalum.

A second barrier metal layer pattern 229b may be provided on the first barrier metal layer pattern 229a and the metal silicide pattern 226. By way of example only, the second barrier metal layer pattern 229b may include titanium nitride and/or tantalum nitride.

A metal pattern 230a may be provided on the insulating interlayer 218 to fill the first opening 220. The metal pattern 230a may be provided in a line type extending in the first direction.

The polysilicon pattern 224, the metal silicide pattern 226 and the metal pattern 230a may compose a bit line structure making contact with the first lower plug 216a. The bit line structure may function as a bit line contact and a bit line.

A second hard mask pattern 232 may be provided on the bit line structure. A second spacer (not shown) may be provided on side surfaces of the bit line structure and the second hard mask pattern 232.

An upper insulation layer 234 may be provided on the second hard mask pattern 232 to cover the bit line structure. A second opening 238 may be provided through the upper insulation layer 234, the second hard mask pattern 232, the metal pattern 230a, the barrier metal layer 229, and the insulating interlayer 218 to expose the second lower plug 216b. The second opening 238 may be provided self-aligned by the bit line structure. The second opening 238 may have a bottom surface wider than a top surface of the second lower plug 216b.

A storage node pad 240, which may include a conductive material, may be provided in the second opening 238. A capacitor may be provided on the storage node pad 240.

A method that may be implemented to manufacture the DRAM device shown in FIG. 9 will be described with reference to FIGS. 10 to 20.

Figure 18:
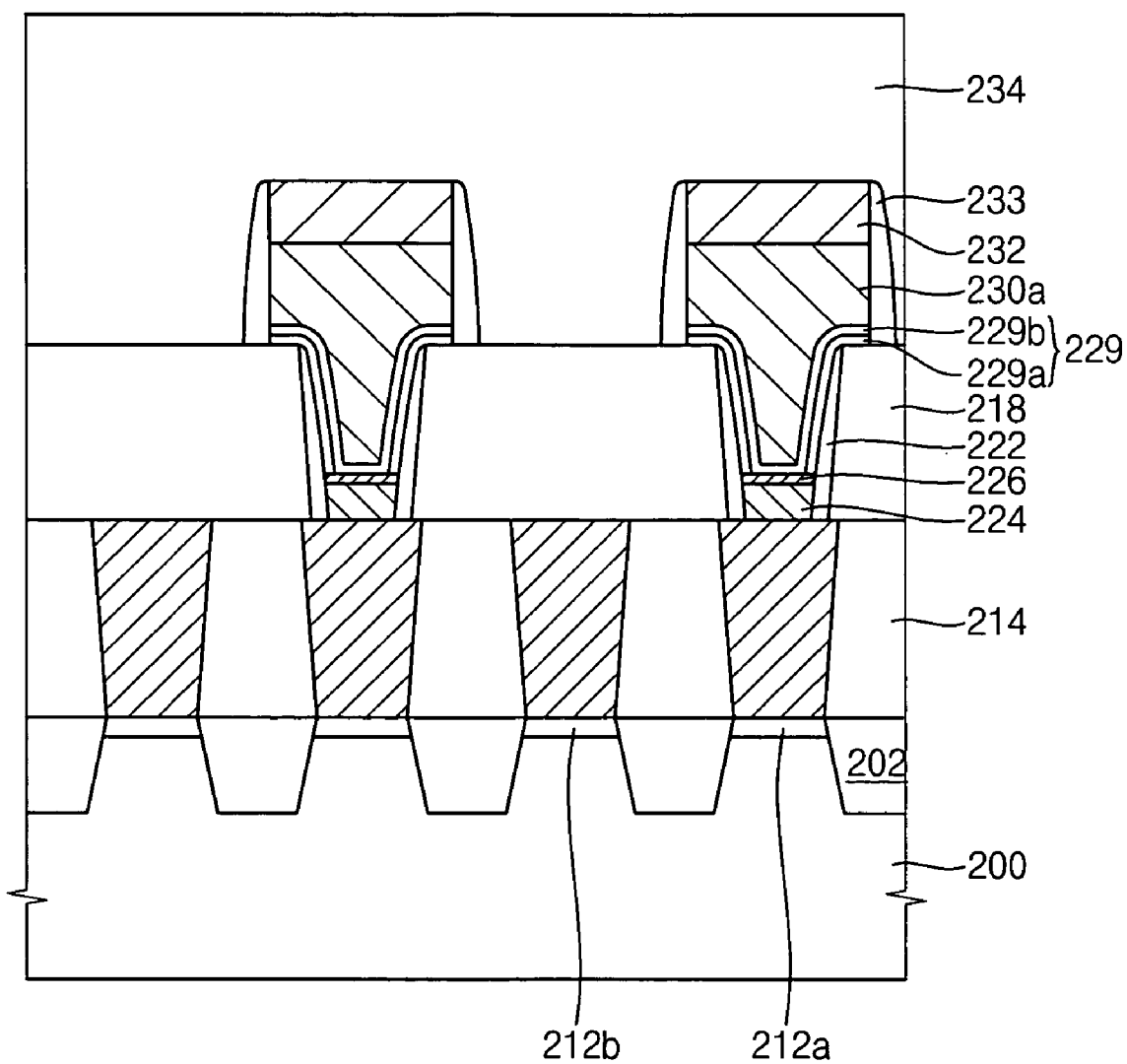
FIGS. 18 to 20 are cross-sectional views taken along a second direction of the method that may be implemented to manufacture the DRAM device shown in FIG. 9.
Figure 19:
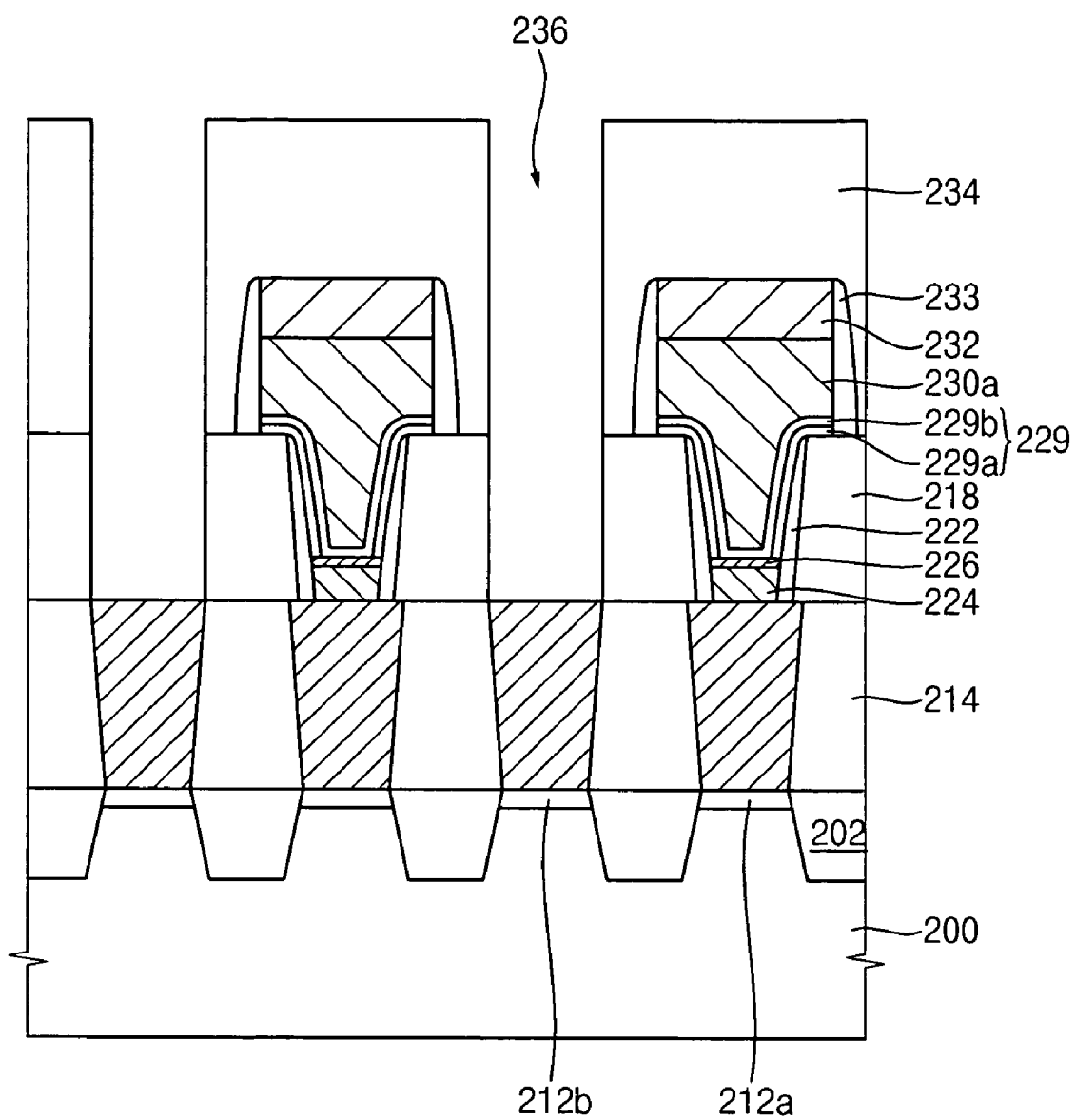
Figure 20:
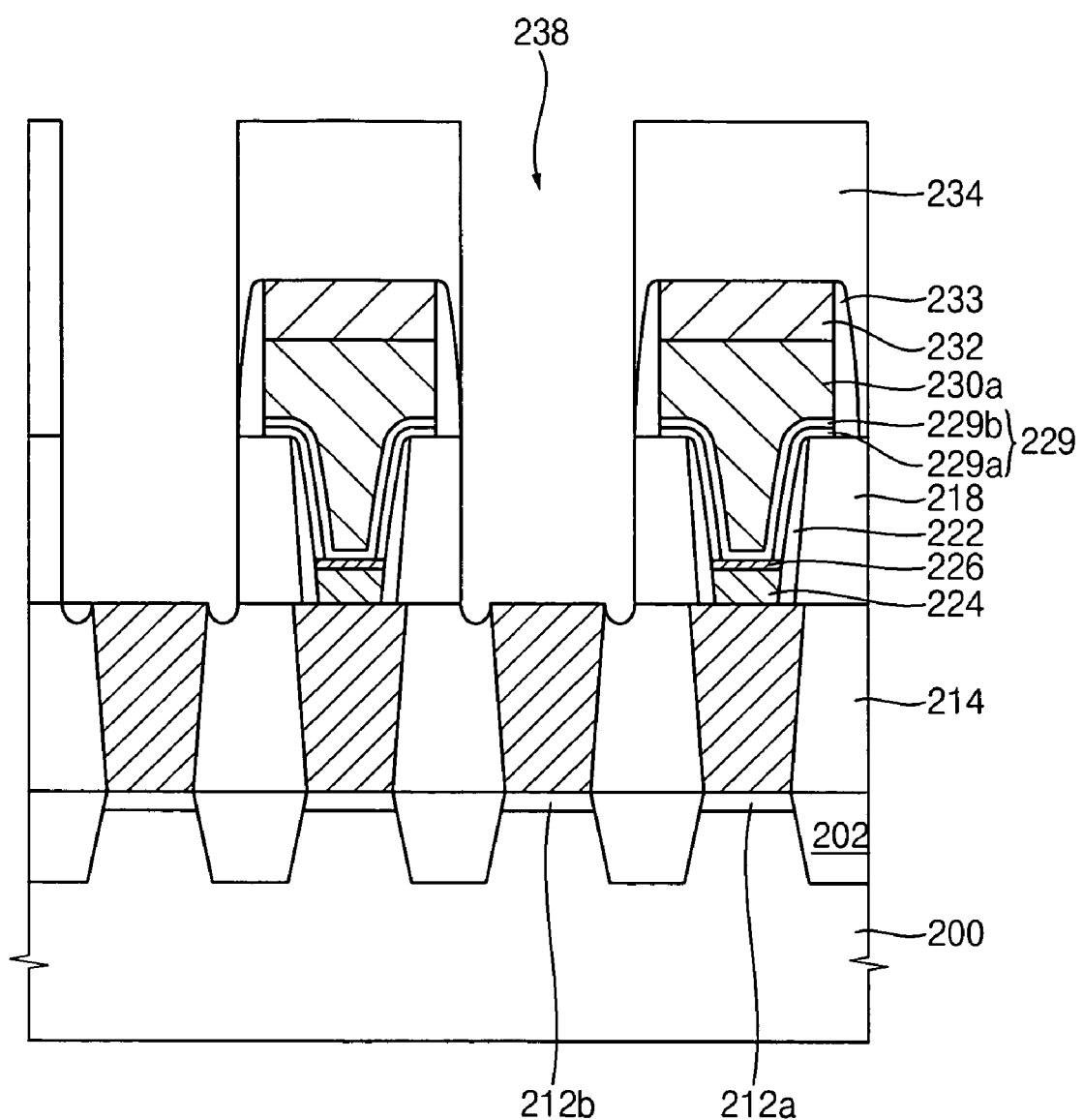

FIGS. 10 to 17 are cross-sectional views of a method that may be implemented to manufacture the DRAM device shown in FIG. 9. FIGS. 18 to 20 are cross-sectional views of a method that may be implemented to manufacture the DRAM device shown in FIG. 9. FIGS. 10 to 17 are cross-sectional views taken along the first direction of the DRAM device shown in FIG. 9, and FIGS. 18 to 20 are cross-sectional views taken along the second direction of the DRAM device shown in FIG. 9.

Figure 10:
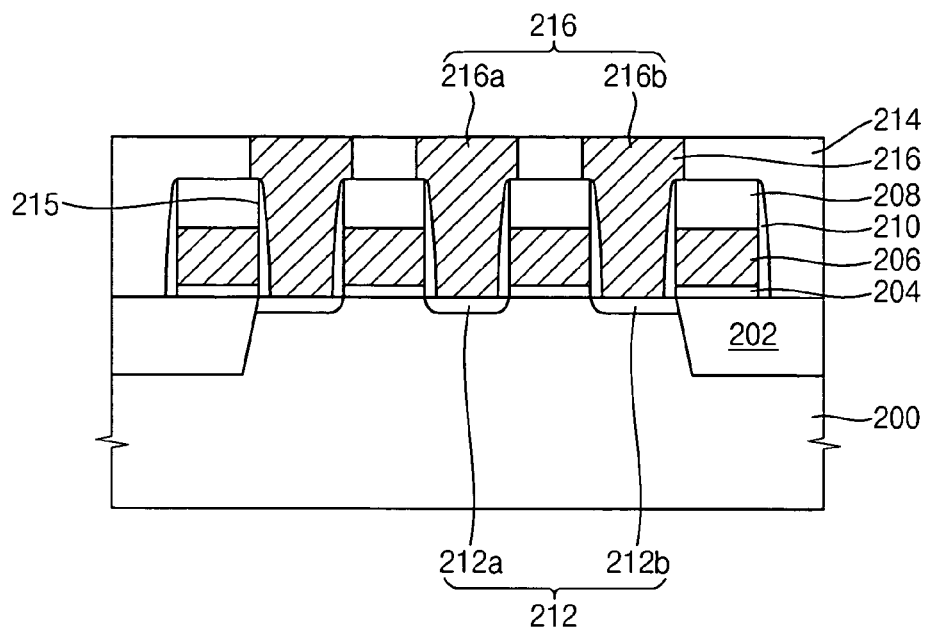
FIGS. 10 to 17 are cross-sectional views taken along a first direction of a method that may be implemented to manufacture the DRAM device shown in FIG. 9.

Referring to FIG. 10, an isolation layer 202 may be provided at an upper portion of the substrate 200 by a trench isolation process (for example) to define an active region and a field region.

A buffer oxide layer (not shown) may be provided on the substrate 200. The buffer oxide layer may alleviate stresses on the substrate 200 when providing a silicon nitride layer (not shown) on the buffer oxide layer in a successive process. After the silicon nitride layer is provided on the buffer oxide layer, the silicon nitride layer may be partially etched to provide a silicon nitride layer pattern (not shown). The buffer oxide layer and the substrate 200 may be etched using the silicon nitride layer pattern as an etching mask to form a trench for isolation. After a silicon oxide layer is formed on the silicon nitride layer to fill up the trench, the silicon oxide layer may be partially removed until the silicon nitride layer pattern may be exposed. The silicon nitride layer pattern and the buffer oxide layer may be removed by a wet etching process (for example) and planarized by a planarization process to provide the isolation layer 202. The active region may be a closed type with the first direction as a length direction.

A top surface of the active region of the substrate 200 may be thermally oxidized to provide a gate oxide layer (not shown). After a gate conductive layer (not shown) and a first hard mask layer (not shown) are provided on the gate oxide layer, the first hard mask layer, the gate conductive layer, and the gate oxide layer may be patterned to form a gate structure, which may include a gate oxide layer pattern 204, a gate conductive pattern 206, and a first hard mask pattern 208, on the substrate 200. The gate structure may be provided in a line type extending toward a second direction perpendicular to the first direction. The gate conductive pattern 206 may function as a word line. In an example embodiment of the present invention, two gate structures may be provided in a line in the active region of the substrate 200.

A gate spacer 210, which may include silicon nitride (for example), may be provided on a sidewall of the gate structure. Impurities may be implanted into top surfaces of the substrate 200 using the gate structure as a mask to form impurity regions 212, which may be used as source/drain regions, at surface portions of the active region adjacent to the gate structure. The impurity regions 212 may include a first impurity region 212a positioned in a central portion of the active region and a second impurity region 212b positioned in an edge portion of the active region. The first impurity region 212a may be connected to a bit line and the second impurity region 212b may be connected to a capacitor.

A lower insulation layer 214 may be provided on the substrate 200 to cover the gate structure. By way of example only, the lower insulation layer 214 may be provided by depositing silicon oxide using a CVD process.

The lower insulation layer 214 may be partially etched to provide lower openings 215 that may expose the first and the second impurity regions 212a and 212b. The lower openings 215 may be provided by a self align contact (SAC) process, for example.

Polysilicon doped with impurities may be deposited on the lower insulation layer 214 to fill the lower openings 215. A planarization process may be performed until a top surface of the lower insulation layer 214 may be exposed to provide a first lower plug 216a that may be electrically connected to the first impurity region 212a and a second lower plug 216b that may be electrically connected to the second impurity region 212b.

Figure 11:
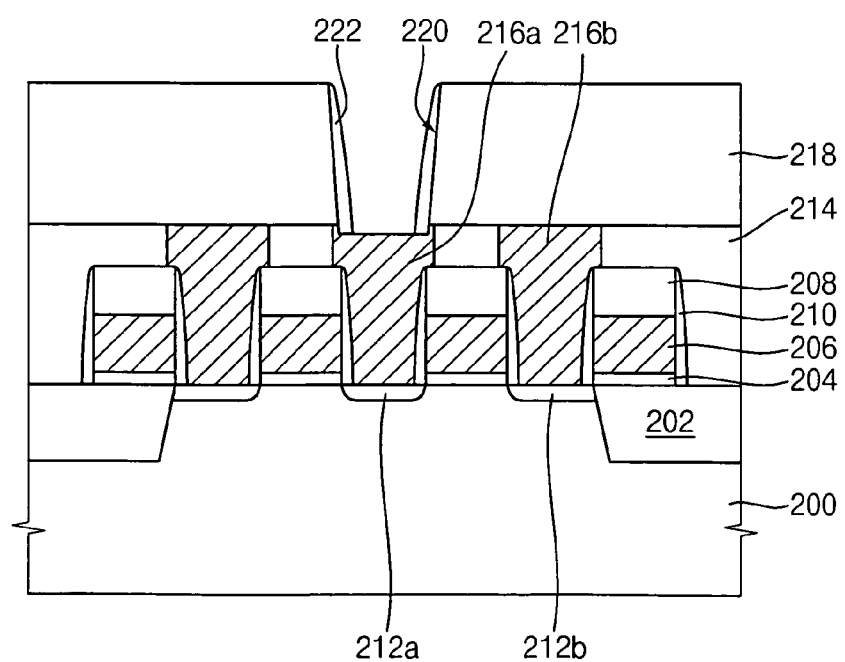

Referring to FIG. 11, an insulating interlayer 218 may be provided on the lower insulation layer 214 having the first and the second lower plugs 216a and 216b. By way of example only, the insulating interlayer 218 may be provided by depositing silicon oxide using a CVD process.

The insulating interlayer 218 may have an etching selectivity with respect to the first lower plug 216a and may be partially etched off in such a way that the first lower plug 216a may be exposed. As a result, a first opening 220, through which the first plug 216a may be exposed, may be provided through the insulating interlayer 218.

A silicon nitride layer (not shown) may be provided on the exposed portion of the first lower plug 216a, a side surface of the insulating interlayer 218 defining the first opening 220, and a top surface of the insulating interlayer 218. The silicon nitride layer may be anisotropically etched to form a first spacer 222 on the side surface of the insulating interlayer 218.

As described above, the first spacer 222 may protect the first opening 220 from being enlarged in successive processes, and reduce the likelihood of chemicals in a successive cleaning process permeating into the first opening 220.

Figure 12:
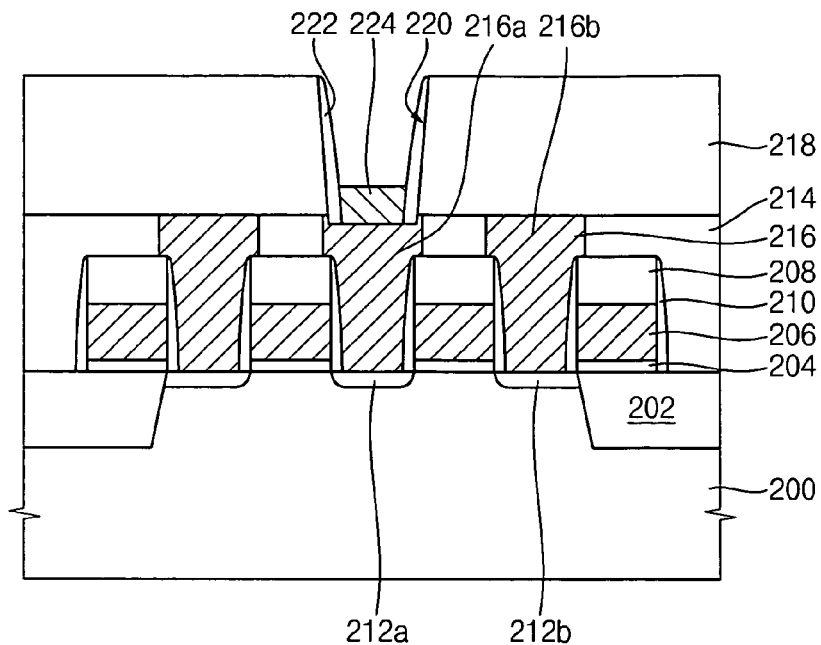

Referring to FIG. 12, a polysilicon pattern 224 may be provided on the exposed portion of the first lower plug 216a to partially fill the first opening 220. When the first opening 220 is filled with the polysilicon pattern 224 and a thickness of the polysilicon pattern 224 is substantially the same as that of the insulating interlayer 218 to form a plug in the opening 220, an electrical resistance of the plug may be high. In addition, when the thickness of the polysilicon layer 224 is no more than about 50 Å, the chemicals may permeate into the insulating interlayer 218 and contact/contaminate a metal silicide pattern 226 (See FIG. 13) provided on the polysilicon pattern 224.

Accordingly, the polysilicon pattern 224 may be provided in the first opening 220 to a thickness of at least about 50 Å but less than the thickness of the insulating interlayer 218, so that the opening 220 may be partially filled with the polysilicon pattern 224.

A process for providing the polysilicon pattern 224 is substantially the same as that described with reference to FIGS. 5 and 6, thus a detailed description of the same is omitted.

Figure 13:
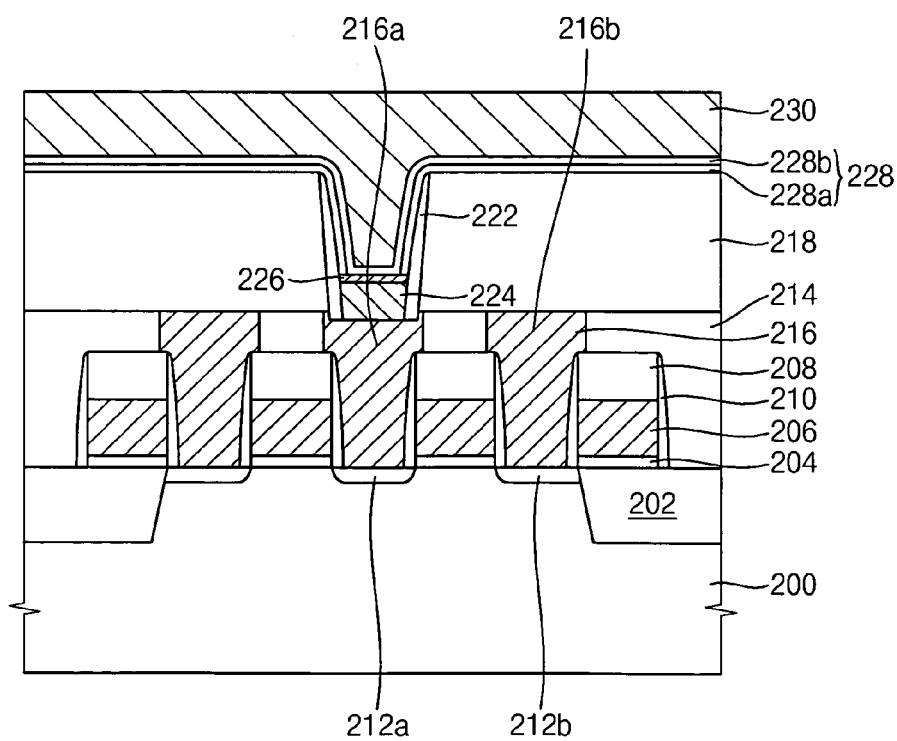

Referring to FIG. 13, the metal silicide pattern 226 may be provided on the polysilicon pattern 224, and a first barrier metal layer 228a may be provided on the first spacer 222 and the insulating interlayer 102.

A first barrier metal may be deposited on the polysilicon pattern 224, the first spacer 222 and the insulating interlayer 218 by a CVD process (for example). The first barrier metal on the polysilicon pattern 224 may be chemically reacted with polysilicon, so that the first barrier metal on the polysilicon pattern 224 may be transformed into the metal silicide pattern 226. However, no chemical reaction may be generated among the first barrier metal and the first spacer 222 and the insulating interlayer 218, so that the first barrier metal on the first spacer 222 and the insulating interlayer 218 may remain unchanged, thereby forming the first barrier metal layer 228a on the first spacer 222 and the insulating interlayer 218.

The metal silicide pattern 226 may be interposed between the polysilicon pattern 224 and a metal pattern that may be provided on the metal silicide pattern 226 in a successive process. The metal silicide pattern 226 may function as an ohmic layer. By way of example only, the first barrier metal layer 228a may be fabricated using titanium and/or tantalum, and the metal silicide pattern 226 may include titanium silicide and/or tantalum silicide according to a material used as the first barrier metal layer 228a.

A second barrier metal layer 228b may be provided on the first barrier metal layer 228a and the metal silicide pattern 226. By way of example only, the second barrier metal layer 228b may be fabricated from titanium nitride and/or tantalum nitride.

A metal layer 230 may be provided on the insulating interlayer 218 to fill the first opening 220. The metal layer 230 may be fabricated from a metallic material capable of being patterned by an anisotropic etching process. By way of example only, the metal layer 230 may be fabricated from tungsten and/or aluminum. In an example embodiment of the present invention, the metal layer 230 may be fabricated from tungsten, which may have a good thermal stability. The metal layer 230 may be provided on the insulating interlayer 218 with a sufficient height to have a low resistance. The metal layer 230 may be used as the bit line through successive processes. The processing steps for providing the metal silicide pattern 226, the first and the second barrier metal layers 228a and 228b, and the metal layer 230 are substantially the same as those described with reference to FIGS. 7 and 8, thus detailed descriptions of the same are omitted.

A planarization process such as (for example) a CMP process and an etch back process may be further performed on the metal layer 230.

Figure 14:
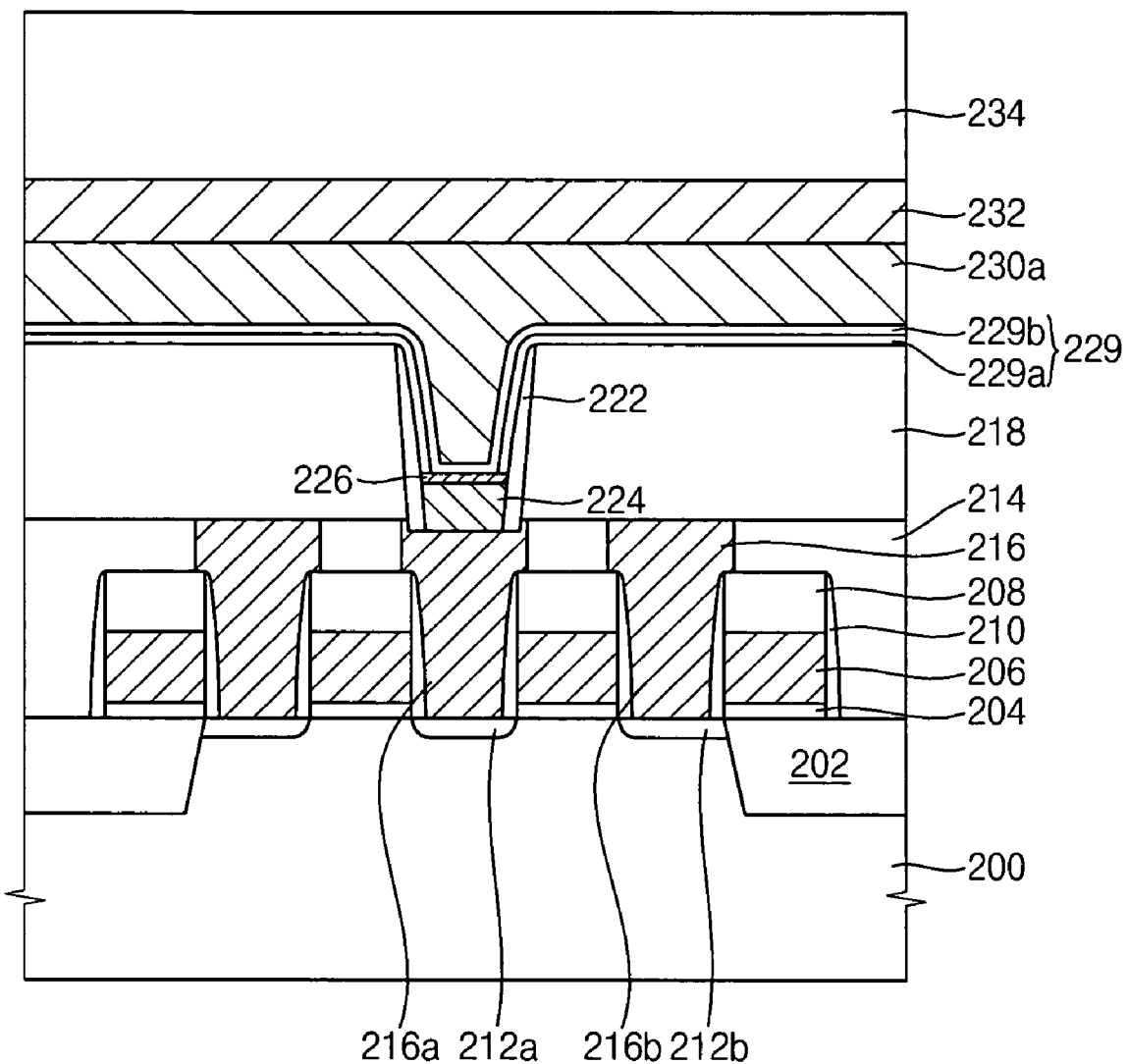

Referring to FIGS. 14 and 18, a second hard mask layer (not shown) may be provided on the metal layer 230, and may be partially etched to form a second hard mask pattern 232, which may correspond to a bit line structure of the DRAM device. The second hard mask pattern 232 may extend in the first direction as a line shape.

The metal layer 230 and the second and the first barrier metal layers 228b and 228a may be etched using the second hard mask pattern 232 to form a bit line structure including a first barrier metal layer pattern 229a, a second barrier metal layer pattern 229b, and a metal pattern 230a on the insulating interlayer 218. The bit line structure may extend in the first direction as a line shape and may include a plug and a bit line in one body.

As shown in FIG. 14, the bit line structure may have the same cross sectional structure as that prior to a patterning process for forming the bit line structure that is cut along the first direction of the DRAM device. However, the cross sectional structure of the bit line structure will be appreciated when the DRAM device is cut along the second direction, as shown in FIG. 18.

A silicon nitride layer may be provided on the bit line structure, the second hard mask pattern 232, and the insulating interlayer 218. The silicon nitride layer may be anisotropically etched to form a second spacer 233 (as shown in FIG. 18) that may protect the bit line on sidewalls of the bit line structure and the second hard mask pattern 232.

An upper insulation layer 234 may be provided on the insulating interlayer 218 to sufficiently cover the second hard mask pattern 232 and the spacer 233. By way of example only, the upper insulation layer 234 may be provided by depositing silicon oxide using a CVD process.

Referring to FIGS. 15 to 19, the upper insulation layer 234, the second hard mask pattern 232, the metal pattern 230a and the insulating interlayer 218 may be partially etched to provide a preliminary second opening 236 that may expose the second lower plug 216b.

Before a conductive material is filled into the preliminary second opening 236, a cleaning process for removing etching by-products and/or particles remaining in the preliminary second opening 236 may be performed in the preliminary second opening 236. However, the upper insulation layer 234 and the insulating interlayer 218 may be partially etched off in the cleaning process, so that the preliminary second opening 236 may be enlarged. In the present embodiment, considering an increase of an inner diameter of the preliminary second opening 236 during a cleansing process, a cross sectional area of the preliminary second opening 236 may be smaller than a top surface of the second lower plug 216b and the second lower plug 216b may be partially exposed through the preliminary second opening 236.

Figure 15:
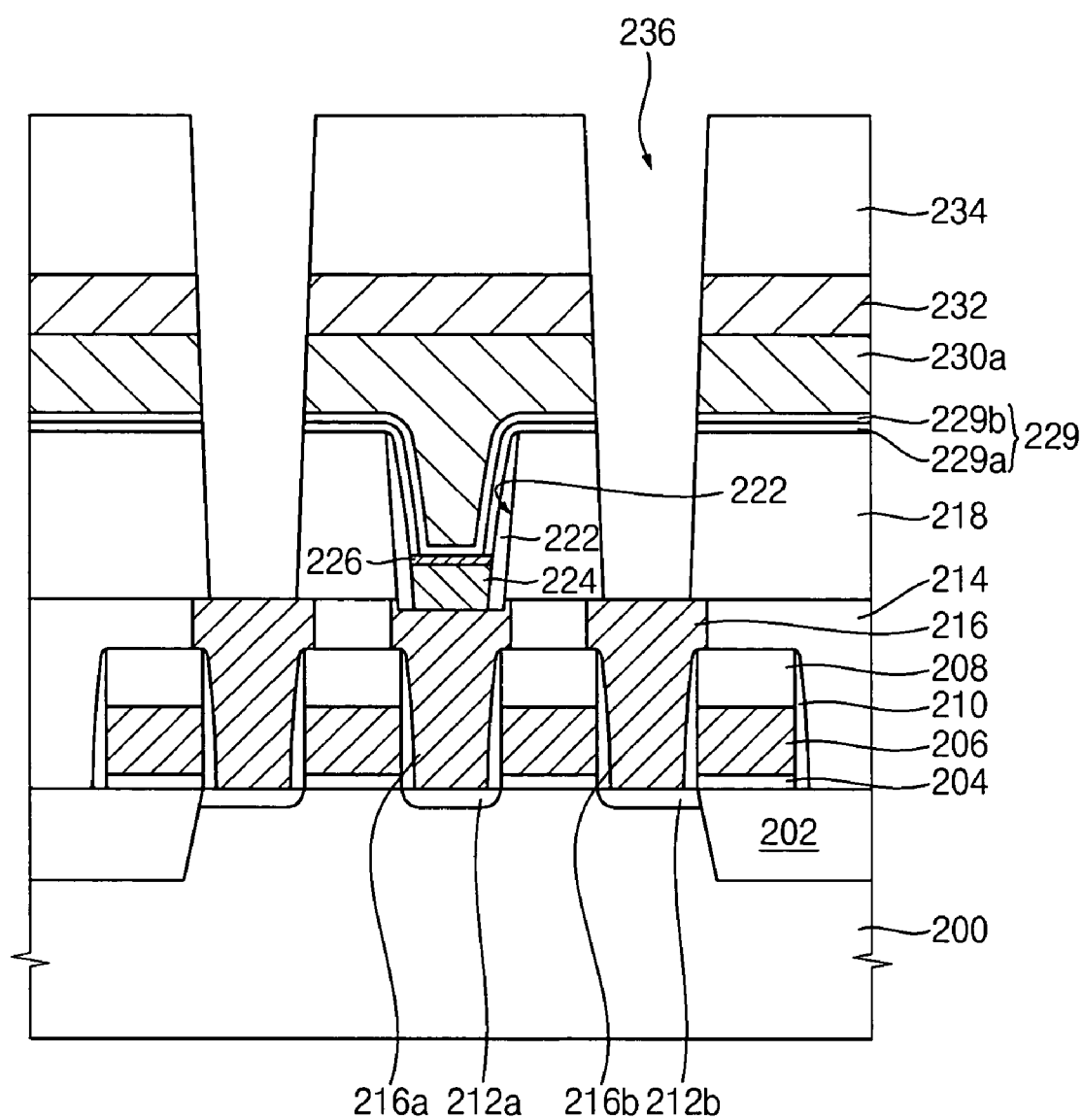

As shown in FIG. 15, because the bit line structure may be provided behind the preliminary second opening 236, the bit line structure may not be etched during the formation process of the preliminary second opening 236.

Figure 16:
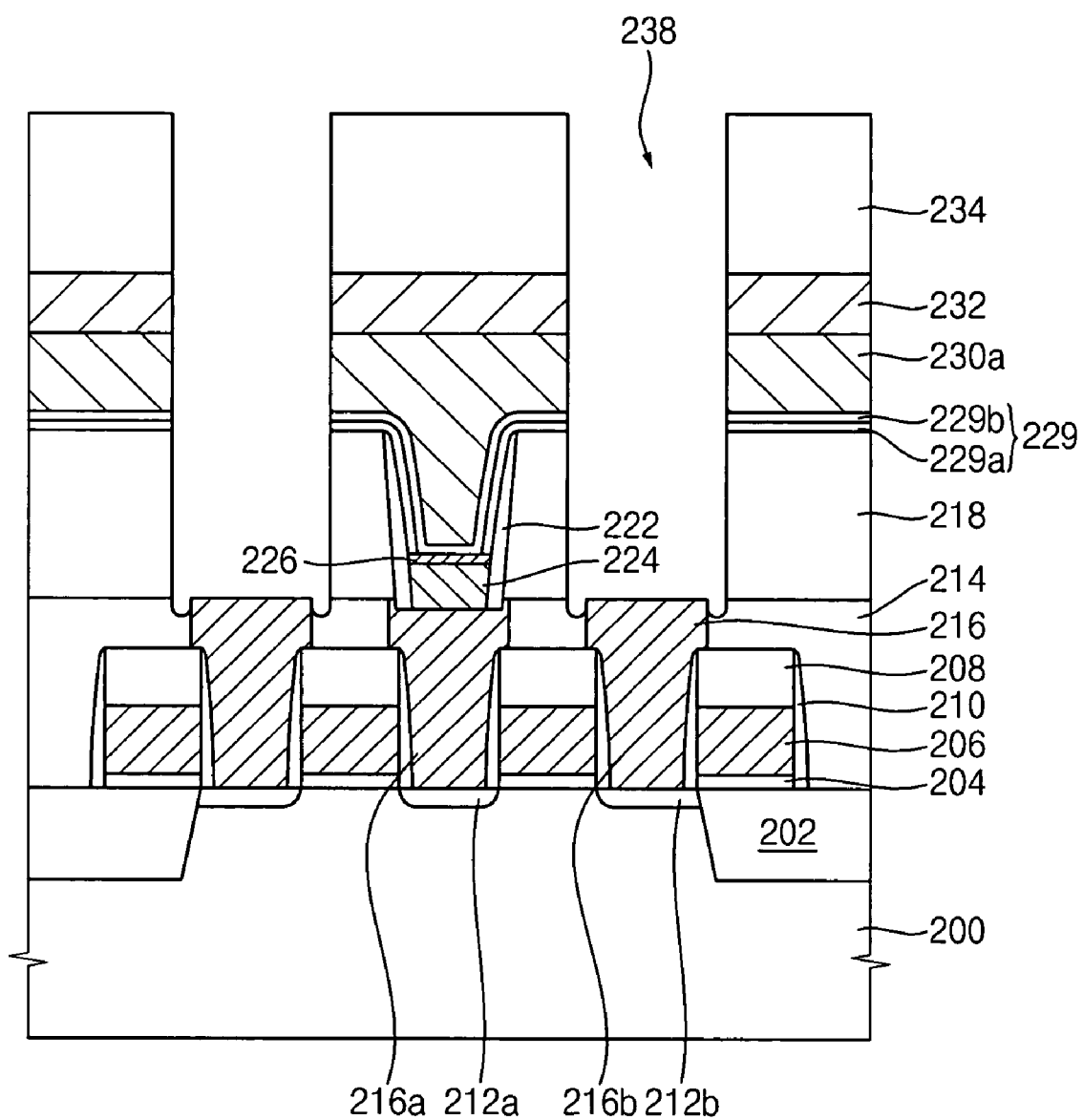

Referring to FIGS. 16 and 20, the upper insulation layer 234, the second hard mask pattern 232, the metal pattern 230a and the insulating interlayer 218 may be removed from the preliminary second opening 236 by a wet etching process, so that the preliminary second opening 236 may be enlarged to provide a second opening 238. For example, a low ammonium fluoride liquid (LAL), which may be a mixture of $NHF_4$, HF, and deionized water, may be used as an etchant for the wet etching process. The wet etching process may also remove etching by-products and particles from the preliminary second opening 236, so that no etching byproducts and particles remain in the second opening 238.

The chemical components of the etchant may diffuse into the first opening 220 through pores, and/or weak portions of the upper insulation layer 234 and the insulating interlayer 218. According to a conventional structure of the DRAM device as described above, when the chemicals diffuse into the first opening, the metal silicide pattern may be partially removed from the semiconductor substrate by the chemicals, which may generate a processing defect because the metal silicide pattern of the bit line structure may make direct contact with the first lower plug. However, according to an example embodiment of the present invention, the polysilicon pattern 224 may be interposed between the metal silicide pattern 226 of the bit line structure and the first lower plug 216a, so that the metal silicide pattern 226 may be provided at a sufficiently high position from a bottom portion of the first opening 220. As a result, the polysilicon pattern 224 may protect the metal silicide pattern 226 from being removed due to the chemicals diffused into the bottom portion of the first opening 220. Further, the first spacer 222 may reduce the likelihood of the chemicals permeating into a sidewall of the first opening 220, thus the metal silicide pattern 226 on the polysilicon pattern 224 may not be removed by the chemicals. Accordingly, the metal silicide pattern 226 (which may be vulnerable to the chemicals) may be protected from the chemicals by the first spacer 222 and the polysilicon pattern 224.

Figure 17:
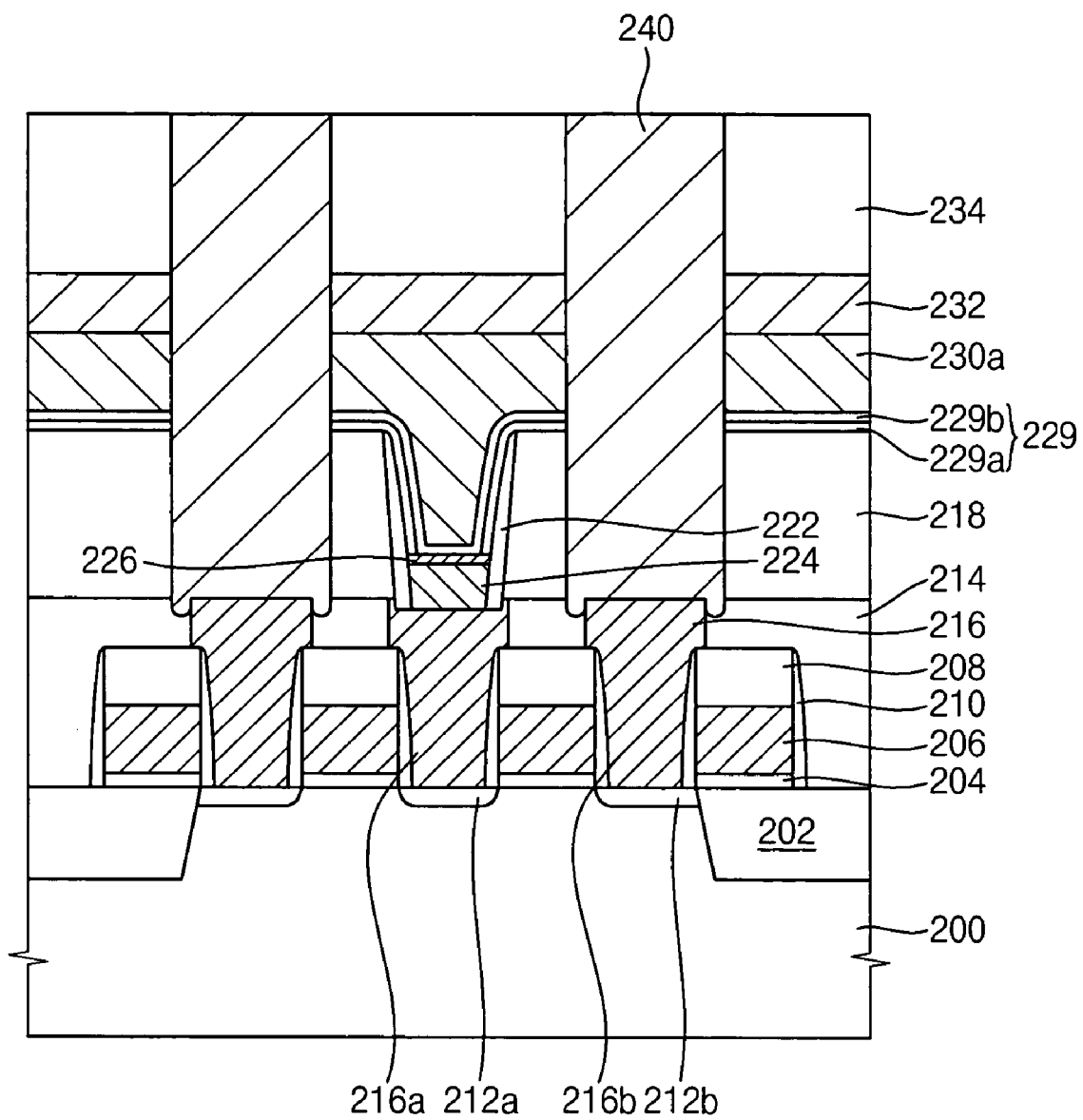

Referring to FIG. 17, and by way of example only, a conductive layer may be provided on the upper insulation layer 234 with a sufficient thickness to fill the second opening 238 by a CVD process. The conductive layer may be partially removed by a CMP process and/or an etch-back process until a top surface of the upper insulation layer 234 may be exposed. Accordingly, the conductive layer may remain only in the second opening 238, thereby providing a storage node contact 240 in the second opening 238. The conductive layer may comprise a conductive material having a good gap-fill characteristic and polysilicon (for example) may be used as the conductive material in the present embodiment of the present invention.

A capacitor (not shown) may be provided on a resultant structure including the storage node contact 240, and may be electrically connected to the storage node contact 240.

As described above, the polysilicon pattern may be interposed between the first lower plug and the metal silicide pattern, so that the metal silicide pattern may be protected from being damaged by chemicals. Thus, various processing defects due to damages to the metal silicide pattern such as a high electrical resistance and/or a contact error between the bit line structure and the first lower plug may be reduced.

According to example embodiments of the present invention, defects of a metal silicide pattern used as an ohmic layer may be reduced in a formation of a wiring structure of a semiconductor device. Accordingly, a DRAM device may include a wiring structure having reduced electrical resistance and reduced contact error, so that operation characteristics, reliabilities, and yields of the DRAM device may be improved (as compared to conventional devices).

The foregoing is illustrative of example embodiments of the present invention and is not to be construed as limiting thereof. Although example embodiments of the present invention have been described, those skilled in the art will readily appreciate that many modifications may be suitably implemented without departing from the novel teachings of the present invention. Accordingly, all such modifications are intended to fall within the spirit and scope of the present invention as defined by the appended claims.

What is claimed is:

1. A wiring structure of a semiconductor device, comprising:
    an insulation layer provided on a substrate, the insulation layer having an opening through which a contact region is exposed;
    a spacer provided on a sidewall of the opening;
    a plug including a polysilicon pattern doped with impurities, a metal silicide pattern, and a metal pattern sequentially stacked on the contact region in the opening; and
    a barrier metal layer structure on the metal silicide pattern and a sidewall of the spacer, the barrier metal layer structure being beneath the metal pattern.

2. The wiring structure of claim 1, wherein the polysilicon pattern has a thickness of at least about 50 Å but less than a thickness of the insulation layer.

3. The wiring structure of claim 1, further comprising a lower plug provided on the substrate wherein the contact region includes a top surface of the lower plug.

4. The wiring structure of claim 3, wherein the lower plug comprises polysilicon doped with impurities.

5. The wiring structure of claim 1, wherein the barrier metal layer structure includes a first barrier layer and a second barrier layer, the first barrier layer being on the sidewall of the spacer, and the second barrier layer being on the metal silicide pattern and the first barrier layer.

* * * * *